(12) United States Patent
Linnen et al.

(10) Patent No.: US 10,886,002 B1
(45) Date of Patent: Jan. 5, 2021

(54) NAND FIELD USE ERASE PLUS DEFECT DETECTIONS

(71) Applicant: SanDisk Technologies LLC, Addison, TX (US)

(72) Inventors: Daniel Linnen, San Jose, CA (US); Avinash Rajagiri, San Jose, CA (US); Yuvaraj Krishnamoorthy, San Jose, CA (US); Srikar Peesari, San Jose, CA (US); Ashish Ghai, San Jose, CA (US); Dongxiang Liao, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/440,212

(22) Filed: Jun. 13, 2019

(51) Int. Cl.
| | |
|---|---|
| *G11C 29/38* | (2006.01) |
| *G06F 13/16* | (2006.01) |
| *G11C 16/04* | (2006.01) |
| *G11C 16/14* | (2006.01) |
| *G11C 29/44* | (2006.01) |

(52) U.S. Cl.
CPC .......... *G11C 29/38* (2013.01); *G06F 13/1668* (2013.01); *G11C 16/0483* (2013.01); *G11C 16/14* (2013.01); *G11C 29/44* (2013.01)

(58) Field of Classification Search
CPC ..... G11C 29/38; G11C 16/0483; G11C 16/14; G11C 29/44; G06F 13/1668
See application file for complete search history.

(56) References Cited

U.S. PATENT DOCUMENTS

| | | | | |
|---|---|---|---|---|
| 2007/0230263 A1* | 10/2007 | Sakakibara | .......... | G11C 29/789 365/49.15 |
| 2014/0071756 A1* | 3/2014 | Iwai | ...................... | G11C 16/10 365/185.11 |
| 2017/0116070 A1* | 4/2017 | Alrod | ..................... | G11C 16/10 |
| 2017/0330635 A1* | 11/2017 | Shepard | ................. | G11C 16/06 |
| 2019/0095123 A1* | 3/2019 | Lin | ........................ | G06F 3/0659 |
| 2020/0020404 A1* | 1/2020 | Kim | .......................... | G11C 8/08 |
| 2020/0226065 A1* | 7/2020 | Yang | ..................... | G06F 3/0632 |

\* cited by examiner

*Primary Examiner* — Kyle Vallecillo
(74) *Attorney, Agent, or Firm* — Dickinson Wright PLLC; Steven Hurles

(57) ABSTRACT

A method for detecting defects in a memory system includes receiving a command to perform a standard erase operation on at least one memory cell of the memory system. The method also includes performing a first defect detection operation on the at least one memory cell. The method also includes setting, in response to the first defect detection operation detecting a defect, a defect status indicator. The method also includes performing the standard erase operation on the at least one memory cell. The method also includes performing a second defect detection operation on the at least one memory cell. The method also includes setting, in response to the second defect detection operation detecting a defect, the defect status indicator.

18 Claims, 6 Drawing Sheets

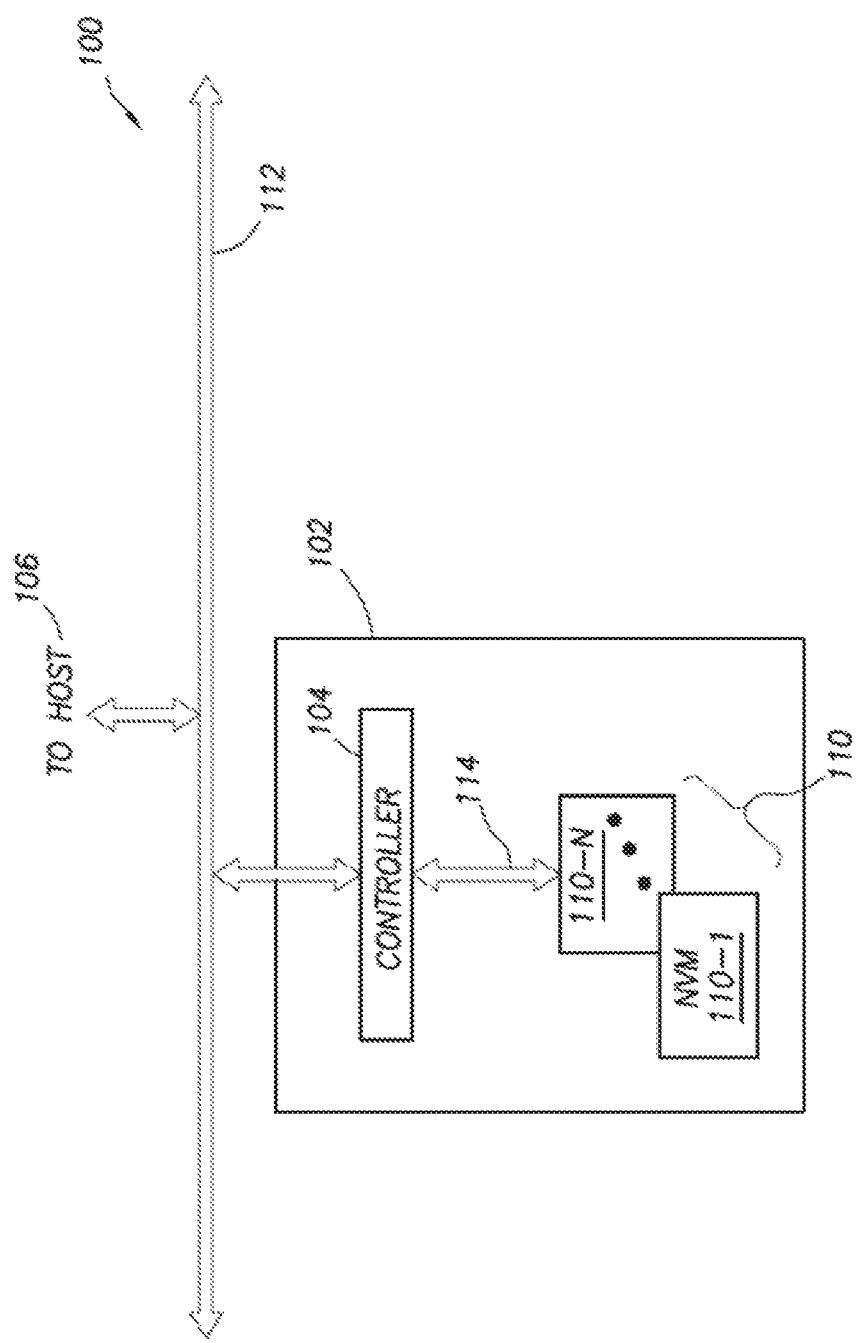

NAND FIELD USE ERASE PLUS DEFECT DETECTIONS

TECHNICAL FIELD

This disclosure relates to memory systems and in particular to systems and methods for NAND field use erase plus defect detections.

BACKGROUND

Non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Typically, such a memory system is tested for defects during production or manufacturing. For example, the memory system may be tested in a production environment (e.g., in a manufacturing factory) of the memory system using various test modes. However, such defects may occur in the memory system as the memory system is used in a customer or user environment. Typically, systems and methods for detecting defects in such an environment may be difficult and may be limited to detecting defects associated with strong shorts in the memory system.

SUMMARY

This disclosure relates generally to memory management systems and methods.

An aspect of the disclosed embodiments is a method for detecting defects in a memory system. The method includes receiving a command to perform a standard erase operation on at least one memory cell of the memory system. The method also includes performing a first defect detection operation on the at least one memory cell. The method also includes setting, in response to the first defect detection operation detecting a defect, a defect status indicator. The method also includes performing the standard erase operation on the at least one memory cell. The method also includes performing a second defect detection operation on the at least one memory cell. The method also includes setting, in response to the second defect detection operation detecting a defect, the defect status indicator.

Another aspect of the disclosed embodiments is a controller that includes a bus interface and a processor. The bus interface is in communication with one or more memory blocks of a memory system. The processor is in communication with the bus interface and configured to: receive a command to perform a standard erase operation on at least one memory block of the memory system; perform a first defect detection operation on the at least one memory block; set, in response to the first defect detection operation detecting a defect, a defect status indicator; perform the standard erase operation on the at least one memory block; perform a second defect detection operation on the at least one memory block; and set, in response to the second defect detection operation detecting a defect, the defect status indicator.

Another aspect of the disclosed embodiments is a memory defect detection method. The method includes receiving a command to perform a standard erase operation on at least one memory cell of a memory system. The method also includes performing, prior to performing the standard erase operation on the at least one memory cell, a first plurality of defect detection operations on the at least one memory cell. The method also includes setting, in response to the first plurality of defect detection operations detecting at least one defect, a defect status indicator. The method also includes performing the standard erase operation on the at least one memory cell. The method also includes performing a second plurality of defect detection operations on the at least one memory cell. The method also includes setting, in response to the second plurality of defect detection operations detecting at least one defect, the defect status indicator.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 1A-1B generally illustrates a block diagram of an example non-volatile memory system according to the principles of the present disclosure.

DETAILED DESCRIPTION

Figure 1B:
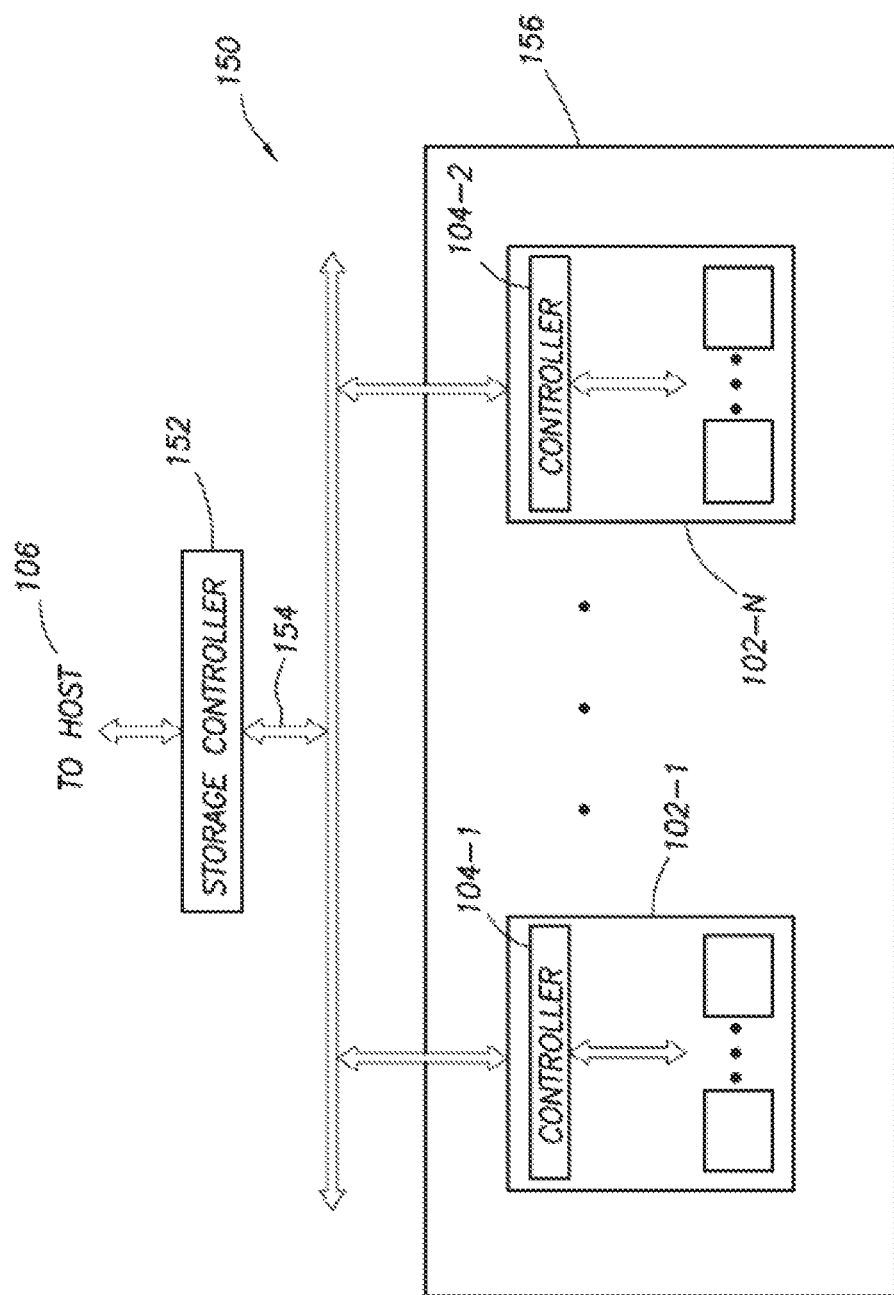

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased. The non-volatile memory may include any suitable type of memory, such as read only memory, NAND flash memory, NOR flash memory, ferroelectric random access memory, or other suitable memory type. The non-volatile memory can include two-dimensional memory, three-dimensional memory, and the like. For example, the non-volatile memory may include bit column stacked (BiCS) NAND flash memory.

Typically, such a memory system is tested for defects during production or manufacturing. The memory blocks of the memory system may be tested in a production environment (e.g., in a manufacturing factory) of the memory system using various test modes, operations, or schemes. For example, one or more memory leakage detection operations may be performed on the memory blocks of the memory system. Such leakage detection operations typically include custom command sequences that run standalone (e.g., not together in an expanded sequence).

However, such defects may occur in the memory blocks as the memory system is used in a customer or user environment (e.g., not in the production environment). Unlike detecting defects in the memory blocks in the production environment, detecting defects in the memory blocks in the customer or user environment may be difficult and the typical systems and methods used for detecting defects may be limited to detecting defects associated with strong shorts in the memory system (e.g., such as shorts that bring down the voltage on pump circuitry associated with the memory system). Such typical systems and methods are not sensitive enough to detect defects, such as memory leakage, before a point of failure in the memory system (e.g., component failure, loss of data, and the like) and typically are not capable of indicating that a defect exists until after the defect, such as memory leakage, is affecting delivered voltage.

Accordingly, systems and methods, such as those described herein, that are configured to detect defects in memory systems being used in the customer or user environment before such defects result in component failure, data loss, data corruption, and the like, may be desirable. In some embodiments, the systems and methods described herein may perform one or more defect detection operations on the memory blocks of the memory system during performance of an erase operation on the memory blocks.

In some embodiments, the systems and methods described herein may perform one or more defect detection operations on the memory blocks after receiving a command to perform the erase operation on the memory blocks. In some embodiments, the systems and methods described herein may be configured to perform one or more defect detection operations on the memory blocks after performing the erase operation on the memory blocks. The systems and methods described herein may be configured to set a defect status indicator in response to detecting one or more defects.

In some embodiments, the systems and methods described herein may be configured to detected defects in the memory blocks before the defects result in component failure in the memory system, data loss or data corruption in the memory system, inefficient performance of the memory system, other undesirable conditions of the defects, or a combination thereof. Additionally, or alternatively, by setting the defect status indicator in response to detecting defects, the systems and methods described herein may be configured to skip defective memory blocks during subsequent performance of operations on the memory blocks, which may improve performance of the memory system and reduce the risk of data loss or data corruption. Further, by performing the defect detection operations during performance of the erase operation on the memory blocks, the systems and methods described herein may be configured to reduce the risk of data loss or data corruption because the memory blocks do not include valid data during the erase operation. This may also reduce recovery time in the event of a failure (e.g., because there is no data to recover). In some embodiments, the systems and methods described herein are transparent to the memory system, which may allow relatively simple firmware architectures to benefit from the systems and methods described herein (e.g., because the defect status indicator will signal the memory system to skip the defective memory blocks).

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102.

The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the controller 104 may receive commands or instructions from the host 106 and may perform read operations, write operations, programming operations, erase operations, other suitable operations, or a combination thereof on the memory of the storage system 102 in response to the commands or instructions communicated by the host 106. The host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

FIG. 1B generally illustrates a block diagram of a system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
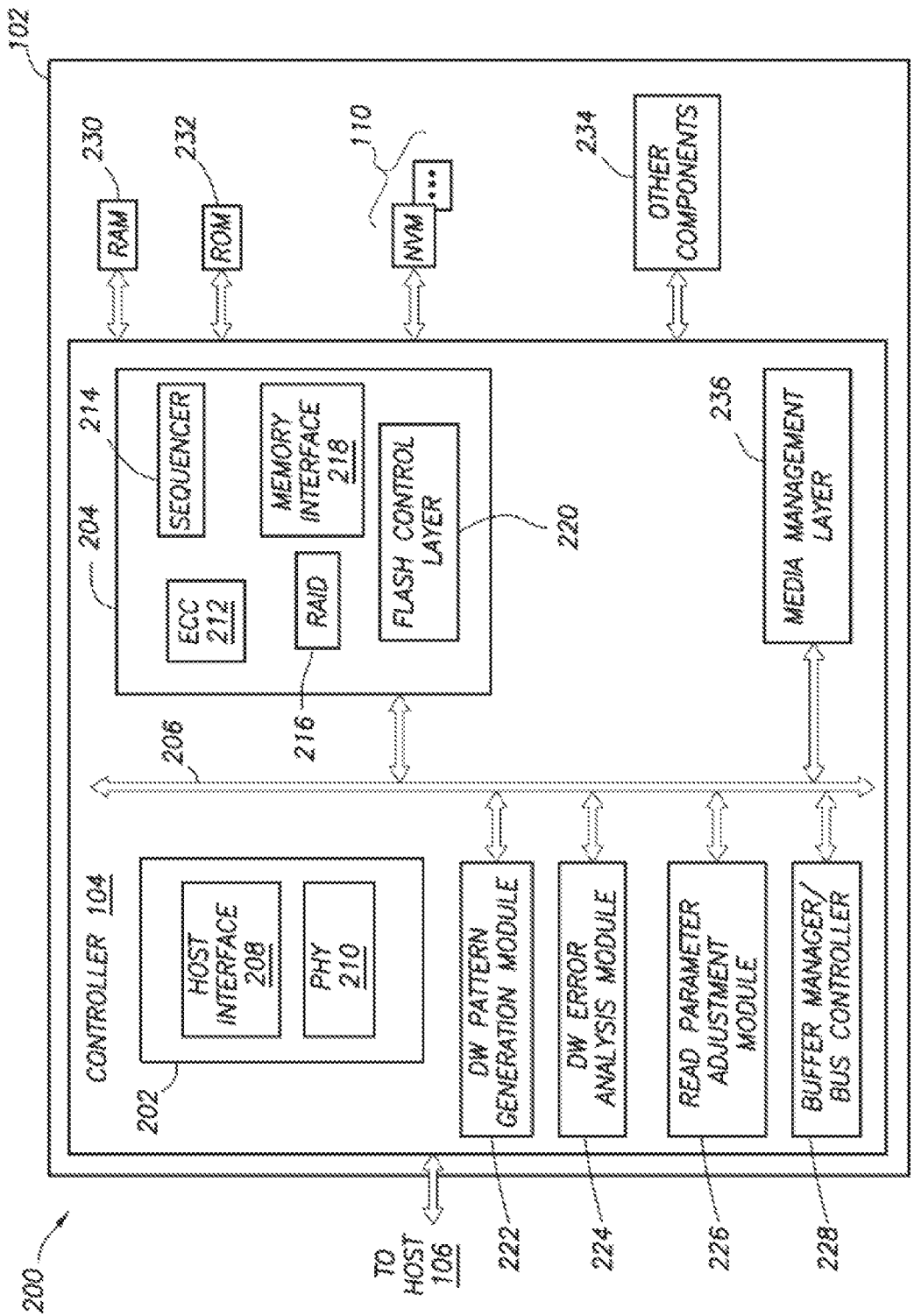
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
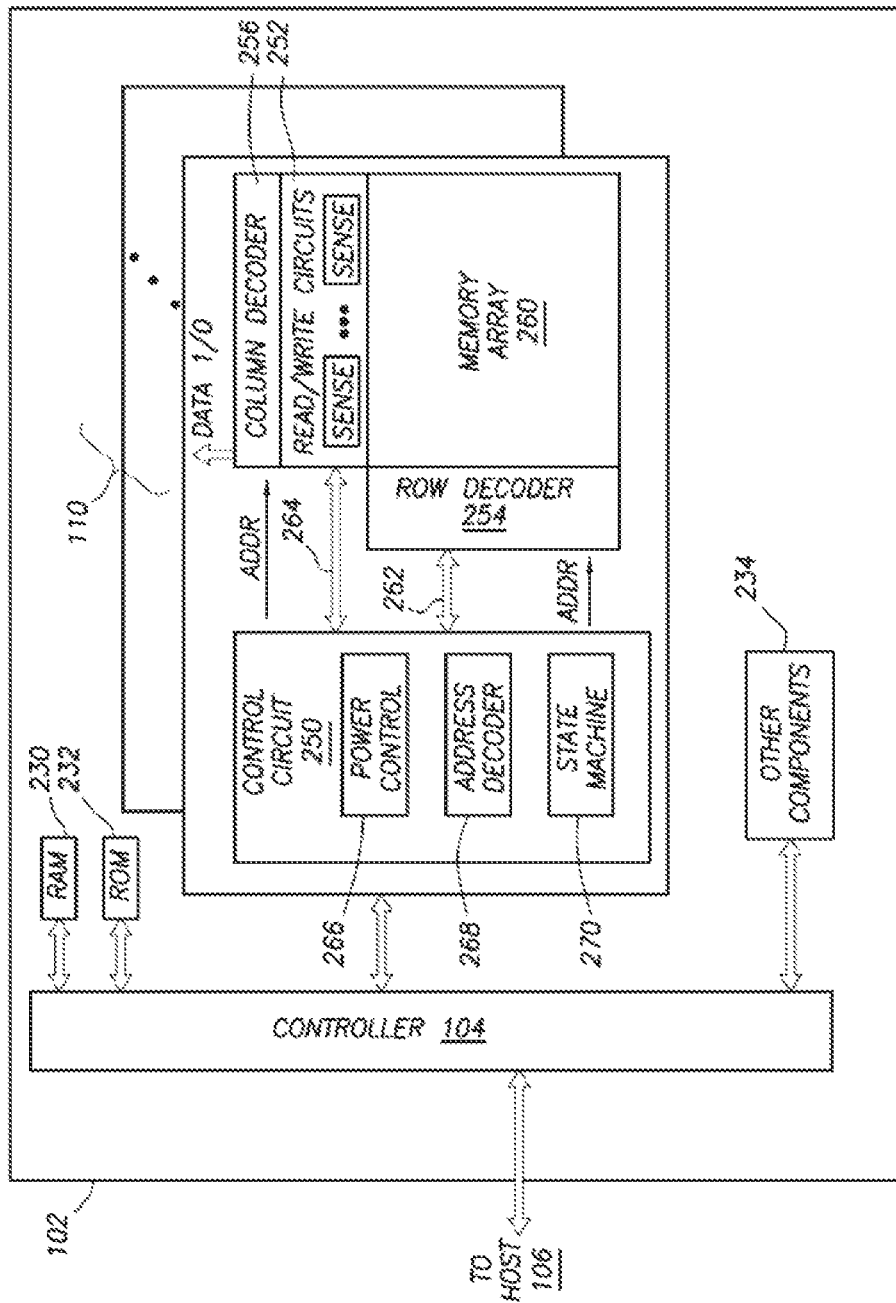
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader.

Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
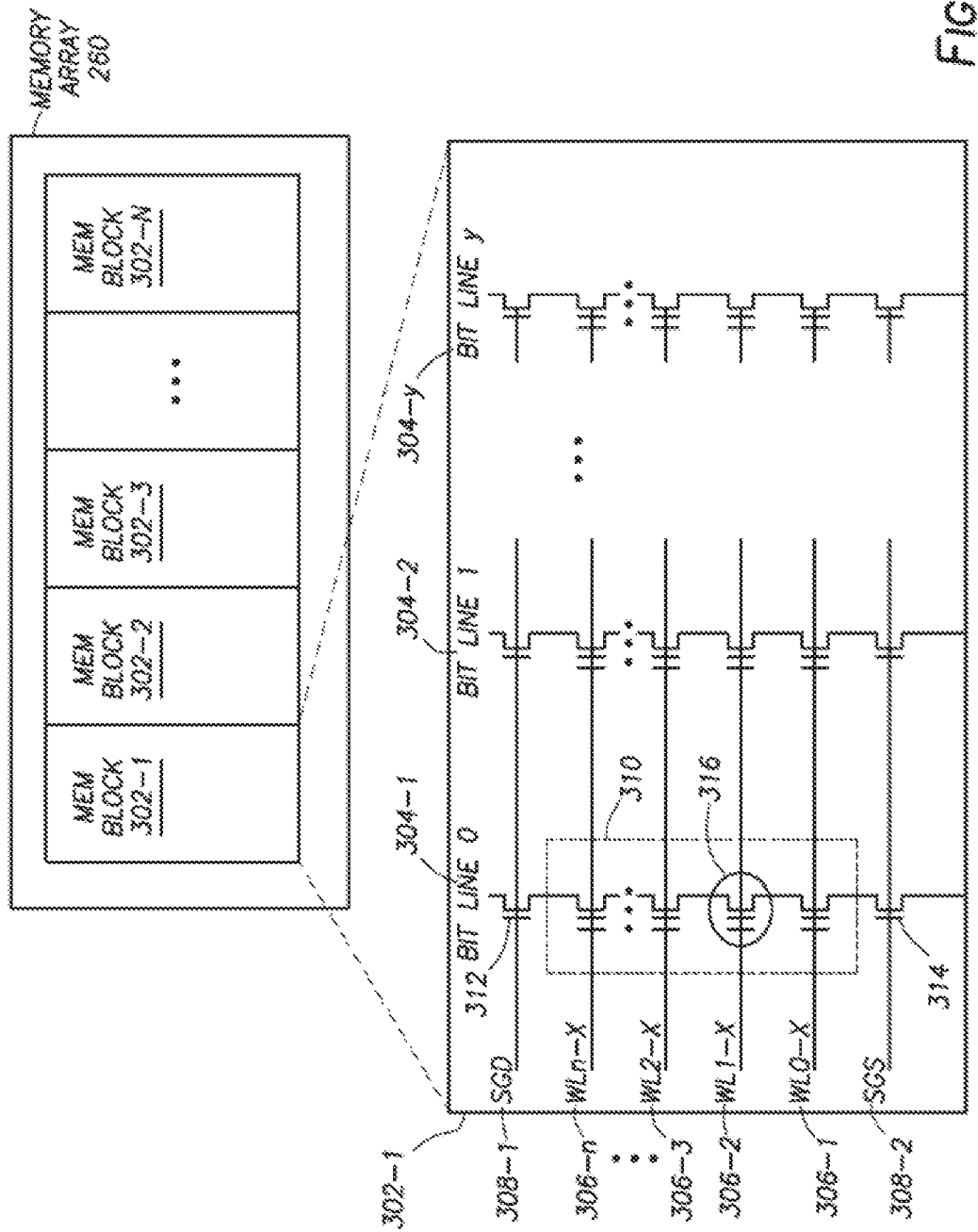
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

In some embodiments, the controller 104 may be configured to detect defects in the memory blocks 302-1 to 302-N by performing one or more defect detection operations on the memory blocks 302-1 to 302-N during performance of a standard erase operation on the memory blocks 302-1 to 302-N. The controller 104 may receive a command to perform a standard erase operation on one or more of the memory blocks 302-1 to 302-N. It should be understood that the command to perform the standard erase operation may be performed on one or more memory cells of the memory blocks 302-1 to 302-N or one or more memory blocks of the memory blocks 302-1 to 302-N. The controller 104 may receive the command to perform the standard erase operation from the host 106 or other suitable source.

Before performing the standard erase operation on the one or more memory blocks 302-1 to 302-N, the controller 104 may perform one or more defect detection operations of a plurality of defect detection operations. The plurality of defect detection operations may include operations to detect word line to word line defects of the one or more memory blocks 302-1 to 302-N, word line to memory hole defects of the one or more memory blocks 302-1 to 302-N, word line to dummy memory hole defects of the one or more memory blocks 302-1 to 302-N, word line to hole replacement defects of the one or more memory blocks 302-1 to 302-N, select gate source line defects of the one or more memory blocks 302-1 to 302-N, memory hole open defects of the one or more memory blocks 302-1 to 302-N, other suitable defect detection operations for detecting other defects, or a combination thereof. The controller 104 may perform any number of the plurality of defect detection operations on the one or more memory blocks 302-1 to 302-N.

When the controller 104 detects one or more defects in a memory block of the one or more memory blocks 302-1 to 302-N by performing one or more of the plurality of defect detection operations before performing the standard erase operation on the one or more memory blocks 302-1 to 302-N, the controller 104 sets a defect status indicator. It should be understood that the controller 104 performs the one or more defect detection operations on each memory blocks of the one or more memory blocks 302-1 to 302-N. The one or more defects may include any defect, such as memory leakage, other suitable defects, or a combination thereof. The defect status indicator indicates that a defect will occur in the memory block or that a defect has occurred in the memory block. The defect status indicator may include any suitable indicator, such as a value set in a register, an indication in the header information of the defective memory block, other suitable indicators, or a combination thereof. In some embodiments, the status indicator may be set to a first value indicating a defect in the memory block and may be set to a second value indicating no defects were detected in the memory block.

The controller 104 may then perform the standard erase operation on the one or more memory blocks 302-1 to 302-N. After performing the standard erase operation on the one or more memory blocks 302-1 to 302-N, the controller 104 may perform one or more defect detection operations of a plurality of defect detection operations. The controller 104 may perform any number of the plurality of defect detection operations on the one or more memory blocks 302-1 to 302-N. When the controller 104 detects one or more defects in a memory block of the one or more memory blocks 302-1 to 302-N by performing one or more of the plurality of defect detection operations after performing the standard erase operation on the one or more memory blocks 302-1 to 302-N, the controller 104 sets the defect status indicator, as described.

In some embodiments, the controller 104 reads the defect status indicator in response to receiving a subsequent command to perform operations on the memory blocks 302-1 to 302-N. The controller 104 identifies memory blocks of the memory blocks 302-1 to 302-N to skip or not use during performance of the subsequent operations based on the defect status indicator. For example, when the defect status indicator indicates that a first memory block of the memory blocks 302-1 to 302-N has a defect or that a defect will occur, the controller 104 determines to not use (e.g., skip) the first memory block when performing the subsequent operations on the memory blocks 302-1 to 302-N.

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 4:
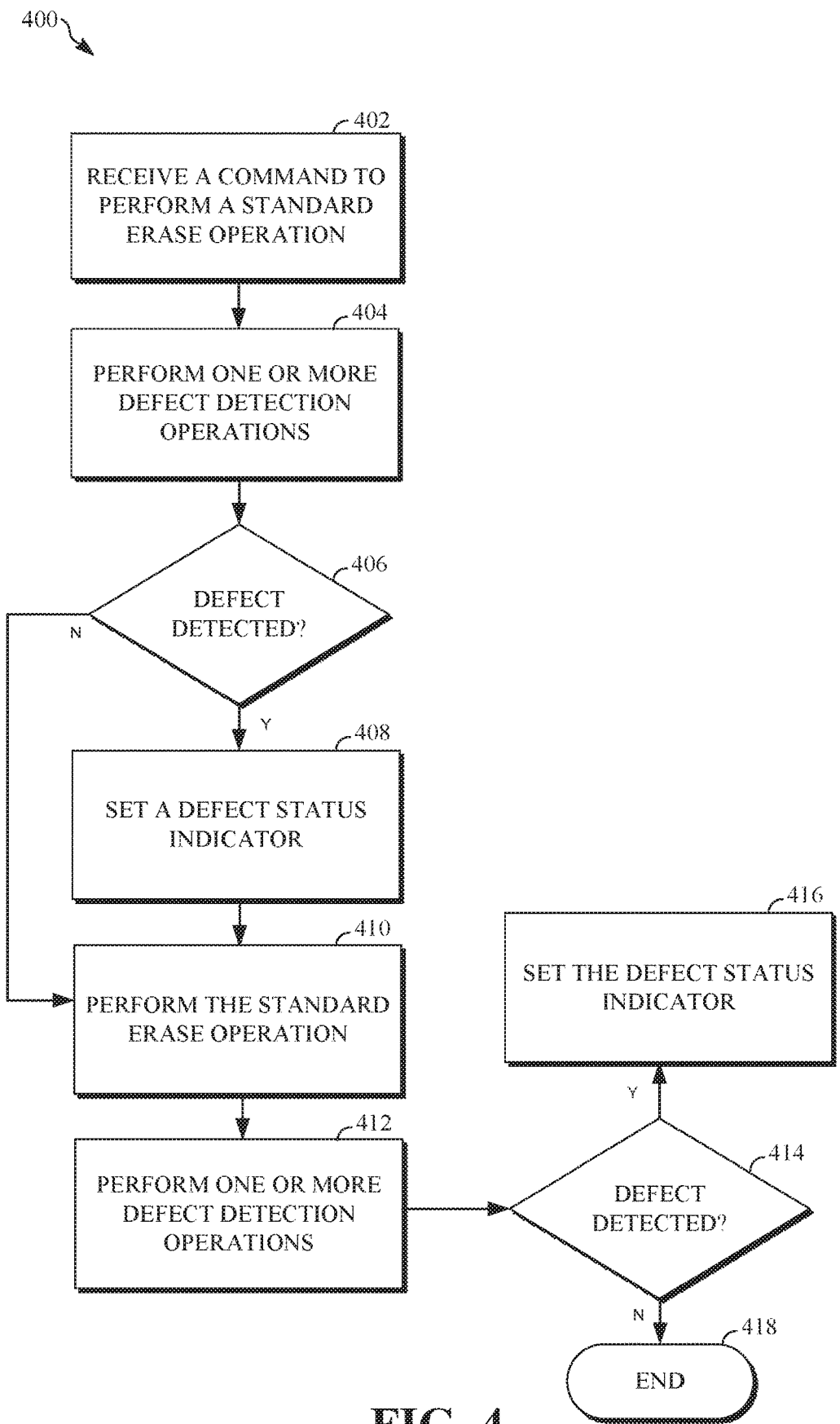
FIG. 4 is a flow diagram generally illustrating a memory defect detection method according to the principles of the present disclosure.

FIG. 4 is a flow diagram illustrating a memory defect detection method 400 according to the principles of the present disclosure. At 402, the method 400 receives a command to perform a standard erase operation. For example, the controller 104 receives the command to perform the standard erase operation on the one or more memory blocks 302-1 to 302-N, as described. At 404, the method 400 performs one or more defect detection operations. For example, the controller 104 performs one or more defect detection operations of the plurality of defect detection operations on the one or more memory blocks 302-1 to 302-N before performing the standard erase operation on the one or more memory blocks 302-1 to 302-N.

At 406, the method determines whether a defect was detected. For example, the controller 104 determines whether one or more defects were detected in memory blocks of the one or more memory blocks 302-1 to 302-N before performing the standard erase operation. When the controller 104 determines that one or more defects were detected in at least one memory block of the one or more memory blocks 302-1 to 302-N, the method 400 continues at 408. When the controller 104 determines that no defects were detected in the one or more memory blocks 302-1 to 302-N, the method 400 continues at 410. At 408, the method 400 sets a defect status indicator. For example, the controller 104 sets the defect status indicator indicating that one or more defects exist in or may occur in the at least one memory block of the one or more memory blocks 302-1 to 302-N.

At 410, the method 400 performs the standard erase operation. For example, the controller 104 performs the standard erase operation on the one or more memory blocks 302-1 to 302-N. At 412, the method 400 performs one or more defect detection operations. For example, the controller 104 performs one or more defect detection operations of the plurality of defect detection operations on the one or more memory blocks 302-1 to 302-N after performing the standard erase operation on the one or more memory blocks 302-1 to 302-N.

At 414, the method determines whether a defect was detected. For example, the controller 104 determines whether one or more defects were detected in memory blocks of the one or more memory blocks 302-1 to 302-N, after performing the standard erase operation. When the controller 104 determines that one or more defects were detected in at least one memory block of the one or more memory blocks 302-1 to 302-N, the method 400 continues at 416. When the controller 104 determines that no defects were detected in the one or more memory blocks 302-1 to 302-N, the method 400 continues at 418. At 416, the method 400 sets the defect status indicator. For example, the controller 104 sets the defect status indicator indicating that one or more defects exist in or may occur in the at least one memory block of the one or more memory blocks 302-1 to 302-N. At 418, the method 400 ends.

In some embodiments, a method for detecting defects in a memory system includes receiving a command to perform a standard erase operation on at least one memory cell of the memory system. The method also includes performing a first defect detection operation on the at least one memory cell. The method also includes setting, in response to the first defect detection operation detecting a defect, a defect status indicator. The method also includes performing the standard erase operation on the at least one memory cell. The method also includes performing a second defect detection operation on the at least one memory cell. The method also includes setting, in response to the second defect detection operation detecting a defect, the defect status indicator.

In some embodiments, at least one of the first defect detection operation and the second defect detection operation is configured to detect word line to word line defects of the at least one memory cell. In some embodiments, at least one of the first defect detection operation and the second defect detection operation is configured to detect word line to memory hole defects of the at least one memory cell. In some embodiments, at least one of the first defect detection operation and the second defect detection operation is configured to detect word line to dummy memory hole defects of the at least one memory cell. In some embodiments, at least one of the first defect detection operation and the second defect detection operation is configured to detect word line to hole replacement defects of the at least one memory cell. In some embodiments, at least one of the first defect detection operation and the second defect detection operation is configured to detect select gate source line defects of the at least one memory cell. In some embodiments, at least one of the first defect detection operation and the second defect detection operation is configured to detect memory hole open defects of the at least one memory cell. In some embodiments, the method also includes performing one or more other defect detection operations on the at least one memory cell, prior to performing the standard erase operation on the at least one memory cell. In some embodiments, the method also includes performing one or more other defect detection operations on the at least one memory cell, after performing the standard erase operation on the at least one memory cell.

In some embodiments, a controller includes a bus interface and a processor. The bus interface is in communication with one or more memory blocks of a memory system. The processor is in communication with the bus interface and configured to: receive a command to perform a standard erase operation on at least one memory block of the memory system; perform a first defect detection operation on the at least one memory block; set, in response to the first defect detection operation detecting a defect, a defect status indicator; perform the standard erase operation on the at least one memory block; perform a second defect detection operation on the at least one memory block; and set, in response to the second defect detection operation detecting a defect, the defect status indicator.

In some embodiments, at least one of the first defect detection operation and the second defect detection operation is configured to detect word line to word line defects of the at least one memory block. In some embodiments, at least one of the first defect detection operation and the second defect detection operation is configured to detect word line to memory hole defects of the at least one memory block. In some embodiments, at least one of the first defect detection operation and the second defect detection operation is configured to detect word line to dummy memory hole defects of the at least one memory block. In some embodiments, at least one of the first defect detection operation and the second defect detection operation is configured to detect word line to hole replacement defects of the at least one memory block. In some embodiments, at least one of the first defect detection operation and the second defect detection operation is configured to detect select gate source line defects of the at least one memory block. In some embodiments, at least one of the first defect detection operation and the second defect detection operation is configured to detect memory hole open defects of the at least one memory block. In some embodiments, the processor is further configured to perform one or more other defect detection operations on the at least one memory block, prior to performing the standard erase operation on the at least one memory block. In some embodiments, the processor is further configured to perform one or more other defect detection operations on the at least one memory block, after performing the standard erase operation on the at least one memory block.

In some embodiments, a memory defect detection method includes receiving a command to perform a standard erase operation on at least one memory cell of a memory system. The method also includes performing, prior to performing the standard erase operation on the at least one memory cell, a first plurality of defect detection operations on the at least one memory cell. The method also includes setting, in response to the first plurality of defect detection operations detecting at least one defect, a defect status indicator. The method also includes performing the standard erase operation on the at least one memory cell. The method also includes performing a second plurality of defect detection operations on the at least one memory cell. The method also includes setting, in response to the second plurality of defect detection operations detecting at least one defect, the defect status indicator.

In some embodiments, the method also includes, in response to the defect status indicator being set, skipping the at least one memory cell during performance of a subsequent operation.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications. In the preceding description and in the claims, the terms "including" and "comprising" are used in an open-ended fashion, and thus should be interpreted to mean "including, but not limited to. . . . " In addition, the term "couple" or "couples" is intended to mean either an indirect or a direct connection. Thus, if a first device couples to a second device, that connection may be through a direct connection or through an indirect connection via other devices and connections.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for detecting defects in a memory system, the method comprising:
    receiving a command to perform a standard erase operation on at least one memory cell of the memory system;
    performing a first defect detection operation on the at least one memory cell;
    setting, in response to the first defect detection operation detecting a defect, a defect status indicator;
    performing the standard erase operation on the at least one memory cell;
    performing a second defect detection operation on the at least one memory cell; and
    setting, in response to the second defect detection operation detecting a defect, the defect status indicator, wherein
    at least one of the first defect detection operation and the second defect detection operation is configured to detect word line to dummy memory hole defects of the at least one memory cell.

2. The method of claim 1, wherein at least one of the first defect detection operation and the second defect detection operation is configured to detect word line to word line defects of the at least one memory cell.

3. The method of claim 1, wherein at least one of the first defect detection operation and the second defect detection operation is configured to detect word line to memory hole defects of the at least one memory cell.

4. The method of claim 1, wherein at least one of the first defect detection operation and the second defect detection operation is configured to detect word line to hole replacement defects of the at least one memory cell.

5. The method of claim 1, wherein at least one of the first defect detection operation and the second defect detection operation is configured to detect select gate source line defects of the at least one memory cell.

6. The method of claim 1, wherein at least one of the first defect detection operation and the second defect detection operation is configured to detect memory hole open defects of the at least one memory cell.

7. The method of claim 1, further comprising, performing one or more other defect detection operations on the at least one memory cell, prior to performing the standard erase operation on the at least one memory cell.

8. The method of claim 1, further comprising, performing one or more other defect detection operations on the at least one memory cell, after performing the standard erase operation on the at least one memory cell.

9. A controller comprising:
a bus interface in communication with one or more memory blocks of a memory system; and
a processor configured to:
receive a command to perform a standard erase operation on at least one memory block of the memory system;
perform a first defect detection operation on the at least one memory block;
set, in response to the first defect detection operation detecting a defect, a defect status indicator;
perform the standard erase operation on the at least one memory block;
perform a second defect detection operation on the at least one memory block; and
set, in response to the second defect detection operation detecting a defect, the defect status indicator,
wherein
at least one of the first defect detection operation and the second defect detection operation is configured to detect word line to dummy memory hole defects of the at least one memory block.

10. The controller of claim 9, wherein at least one of the first defect detection operation and the second defect detection operation is configured to detect word line to word line defects of the at least one memory block.

11. The controller of claim 9, wherein at least one of the first defect detection operation and the second defect detection operation is configured to detect word line to memory hole defects of the at least one memory block.

12. The controller of claim 9, wherein at least one of the first defect detection operation and the second defect detection operation is configured to detect word line to hole replacement defects of the at least one memory block.

13. The controller of claim 9, wherein at least one of the first defect detection operation and the second defect detection operation is configured to detect select gate source line defects of the at least one memory block.

14. The controller of claim 9, wherein at least one of the first defect detection operation and the second defect detection operation is configured to detect memory hole open defects of the at least one memory block.

15. The controller of claim 9, wherein the processor is further configured to perform one or more other defect detection operations on the at least one memory block, prior to performing the standard erase operation on the at least one memory block.

16. The controller of claim 9, wherein the processor is further configured to perform one or more other defect detection operations on the at least one memory block, after performing the standard erase operation on the at least one memory block.

17. A memory defect detection method comprising:
receiving a command to perform a standard erase operation on at least one memory cell of a memory system;
performing, prior to performing the standard erase operation on the at least one memory cell, a first plurality of defect detection operations on the at least one memory cell;
setting, in response to the first plurality of defect detection operations detecting at least one defect, a defect status indicator;
performing the standard erase operation on the at least one memory cell;
performing a second plurality of defect detection operations on the at least one memory cell; and
setting, in response to the second plurality of defect detection operations detecting at least one defect, the defect status indicator.

18. The method of claim 17, wherein, in response to the defect status indicator being set, skipping the at least one memory cell during performance of a subsequent operation.

* * * * *